US009823718B2

(12) United States Patent
Platt et al.

(10) Patent No.: US 9,823,718 B2
(45) Date of Patent: Nov. 21, 2017

(54) DEVICE COOLING

(71) Applicant: Microsoft Technology Licensing, LLC, Redmond, WA (US)

(72) Inventors: David Platt, North Bend, WA (US); Andrew Delano, Woodinville, WA (US); Todd Pleake, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 14/995,034

(22) Filed: Jan. 13, 2016

(65) Prior Publication Data

US 2017/0199553 A1   Jul. 13, 2017

(51) Int. Cl.
H05K 7/20 (2006.01)
G06F 1/20 (2006.01)
H05K 9/00 (2006.01)

(52) U.S. Cl.
CPC ......... G06F 1/203 (2013.01); H05K 7/20445 (2013.01); H05K 9/0007 (2013.01)

(58) Field of Classification Search
CPC .. G06F 1/203; H05K 7/20445; H05K 9/0007; H05K 7/20436; H05K 9/003; H05K 9/0024
See application file for complete search history.

(56) References Cited

U.S. PATENT DOCUMENTS 4,442,450 A * 4/1984 Lipschutz ............. H01L 23/433
                                                      165/80.2
4,570,337 A   2/1986 Butt
4,729,060 A * 3/1988 Yamamoto .......... H01L 23/4332
                                                      165/80.4
5,272,599 A   12/1993 Koenen
5,548,090 A * 8/1996 Harris ................. H01L 23/3675
                                                      174/250
5,930,114 A   7/1999 Kuzmin et al.
6,782,941 B2  8/2004 Lee
6,900,383 B2  5/2005 Babb et al.
7,019,976 B1 * 3/2006 Ahmad ................. H01L 23/433
                                                      165/185

(Continued)

FOREIGN PATENT DOCUMENTS

EP     1791177 A1     5/2007

OTHER PUBLICATIONS

"What are Leading Edge Strategies to Cool Laptop Computers and Cramped Computing Spaces? (part 2 of 2)", Published on: Jul. 11, 2011, Available at: http://www.qats.com/cms/2011/07/11/what-are-leading-edge-strategies-to-cool-laptop-computers-and-cramped-computing-spaces-part-2-of-2/.

*Primary Examiner* — Hoa C Nguyen
*Assistant Examiner* — Keith Depew
(74) *Attorney, Agent, or Firm* — Rainier Patents, P.S.

(57) ABSTRACT

The description relates to devices, such as computing devices. One example can include a processor secured to a circuit board and a self-biasing heat sink positioned over the processor and secured to the circuit board to complete a Faraday Cage around the processor. The self-biasing heat sink can include a peripheral portion positioned in a first plane and a contact portion positioned in a second different plane and biased against the heat generating component by an interposed biasing portion that is flexed to force the contact portion against the processor.

27 Claims, 8 Drawing Sheets

(56) References Cited

U.S. PATENT DOCUMENTS

| | | | |
|---|---|---|---|
| 7,186,590 B2 | 3/2007 | Alcoe et al. | |
| 7,236,368 B2 | 6/2007 | Maxwell et al. | |
| 7,361,844 B2 | 4/2008 | Vinciarelli et al. | |
| 7,361,985 B2 * | 4/2008 | Yuan | H01L 23/3128 257/713 |
| 8,058,724 B2 * | 11/2011 | Refai-Ahmed | H01L 23/3732 257/706 |
| 8,138,512 B2 | 3/2012 | Kang et al. | |
| 8,953,114 B2 | 2/2015 | Kuo et al. | |
| 2003/0024698 A1 * | 2/2003 | Bosak, III | H01L 23/367 165/185 |
| 2003/0193794 A1 * | 10/2003 | Reis | H01L 23/552 361/816 |
| 2005/0180113 A1 * | 8/2005 | Shirakami | H01L 23/373 361/704 |
| 2009/0002949 A1 * | 1/2009 | Pawlenko | H05K 9/0026 361/707 |
| 2010/0027220 A1 * | 2/2010 | Hughes | H05K 7/20445 361/702 |
| 2012/0069522 A1 * | 3/2012 | Hung | H01L 23/34 361/700 |
| 2013/0077282 A1 * | 3/2013 | Malek | H05K 9/003 361/818 |
| 2014/0146479 A1 * | 5/2014 | Kilroy | H01L 23/40 361/717 |
| 2015/0282392 A1 * | 10/2015 | Liu | H05K 9/0024 361/707 |
| 2015/0301568 A1 * | 10/2015 | Hill | H05K 7/20445 361/714 |
| 2016/0135282 A1 * | 5/2016 | Hata | H05K 1/0207 361/720 |

* cited by examiner

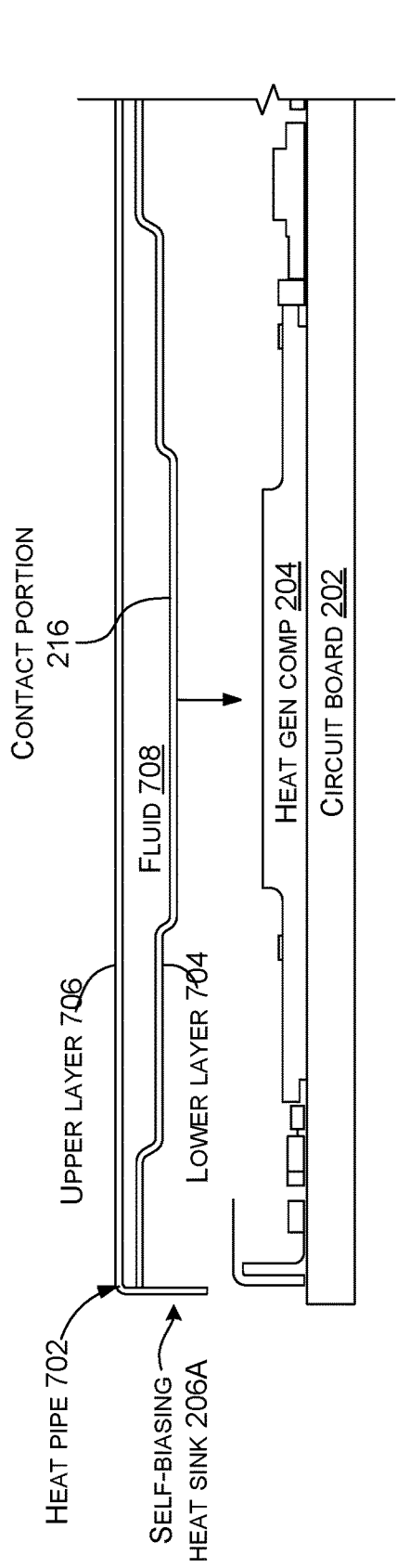
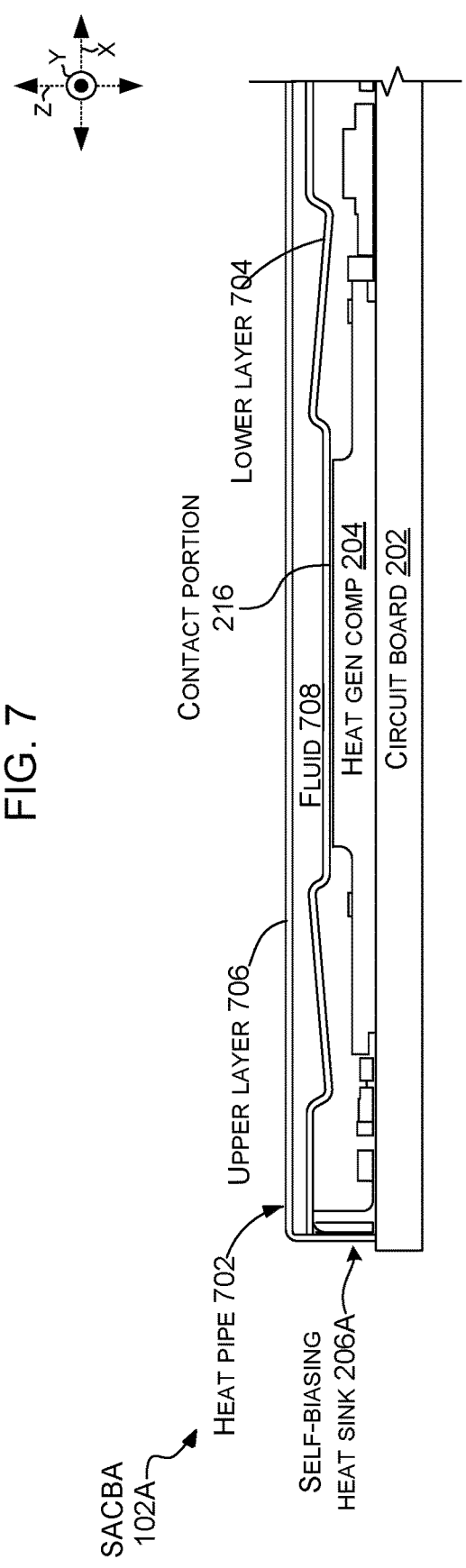
FIG. 7
FIG. 8

DEVICE COOLING

BACKGROUND

The description relates to devices that have heat generating components and to cooling the heat generating components.

BRIEF DESCRIPTION OF THE DRAWINGS

The accompanying drawings illustrate implementations of the concepts conveyed in the present document. Features of the illustrated implementations can be more readily understood by reference to the following description taken in conjunction with the accompanying drawings. Like reference numbers in the various drawings are used wherever feasible to indicate like elements. Further, the left-most numeral of each reference number conveys the FIG. and associated discussion where the reference number is first introduced.

FIGS. 4-12 are sectional views of example self-biasing heat sink implementations in accordance with the present concepts.

DESCRIPTION

The present concepts relate to devices, such as computing devices. For many form factors, such as tablets, notebooks, smart phones, and/or wearable devices, consumer preferences are toward smaller form factors, especially thinner and/or lighter form factors. At the same time, consumers want high performance from computing resources, such as processing resources, memory resources, etc. The high performance tends to result in unwanted heat generation from the computing resources (e.g., heat generating components). This heat can be dispersed via heat sinks that can be positioned proximate to the heat generating components. The heat sink can include a contact portion that is biased toward the heat generating component to facilitate heat transfer (e.g. self-biasing heat sink). The bias can ensure contact with any heat generating component that is within design tolerances. Further, the bias can be overcome by a force imparted by contact with the heat generating component that is low enough to avoid damage to the heat generating component and its connections to other device components.

Figure 1:
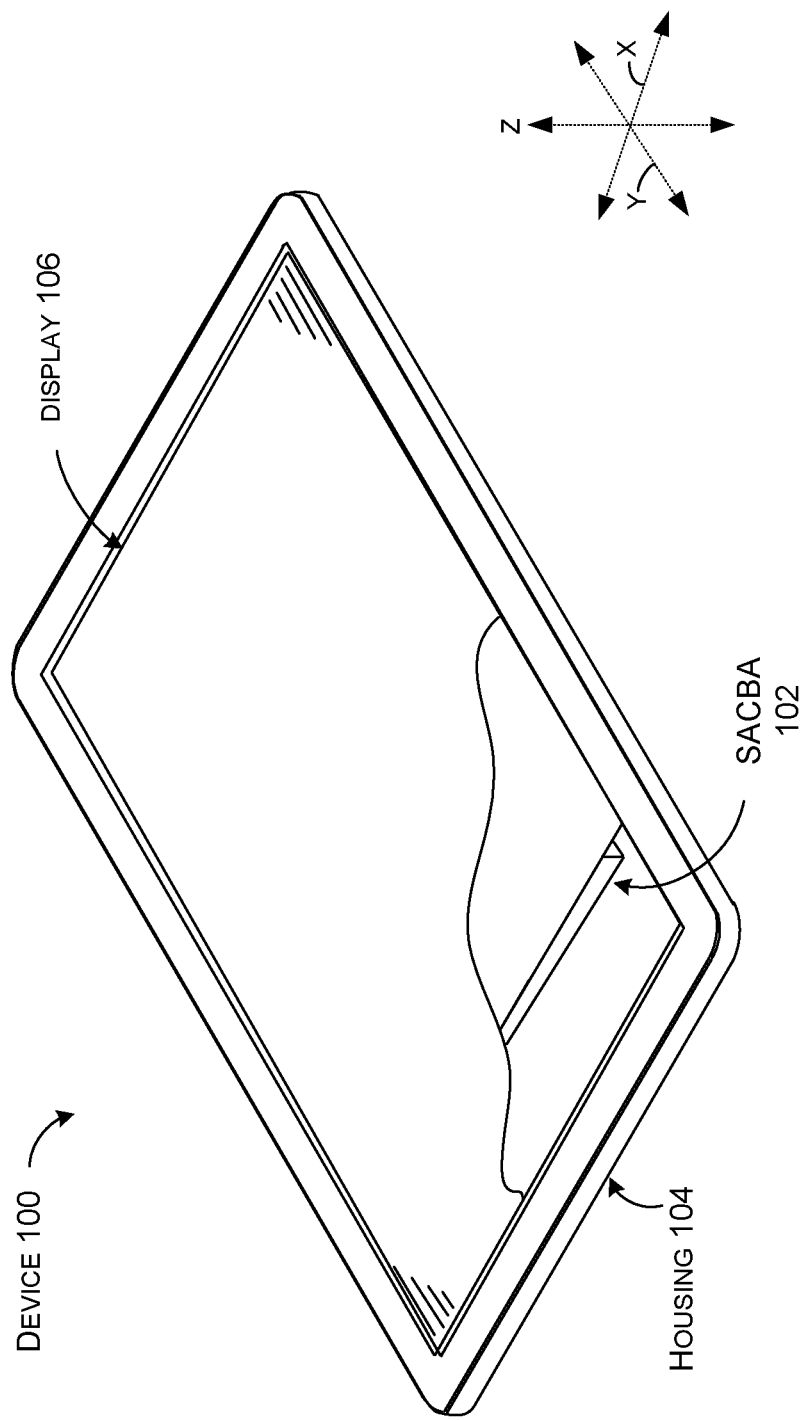
FIG. 1 is a partial cutaway perspective view of an example device that can include the present self-biasing heat sink implementations in accordance with the present concepts.

FIG. 1 shows a partial cut-away view of an example device 100 manifest as a tablet type computing device. In this manifestation, device 100 can include a self-adjusting circuit board assembly 102 (hereinafter, SACBA) that in this example is contained within a housing 104 and a display 106.

Figure 2:
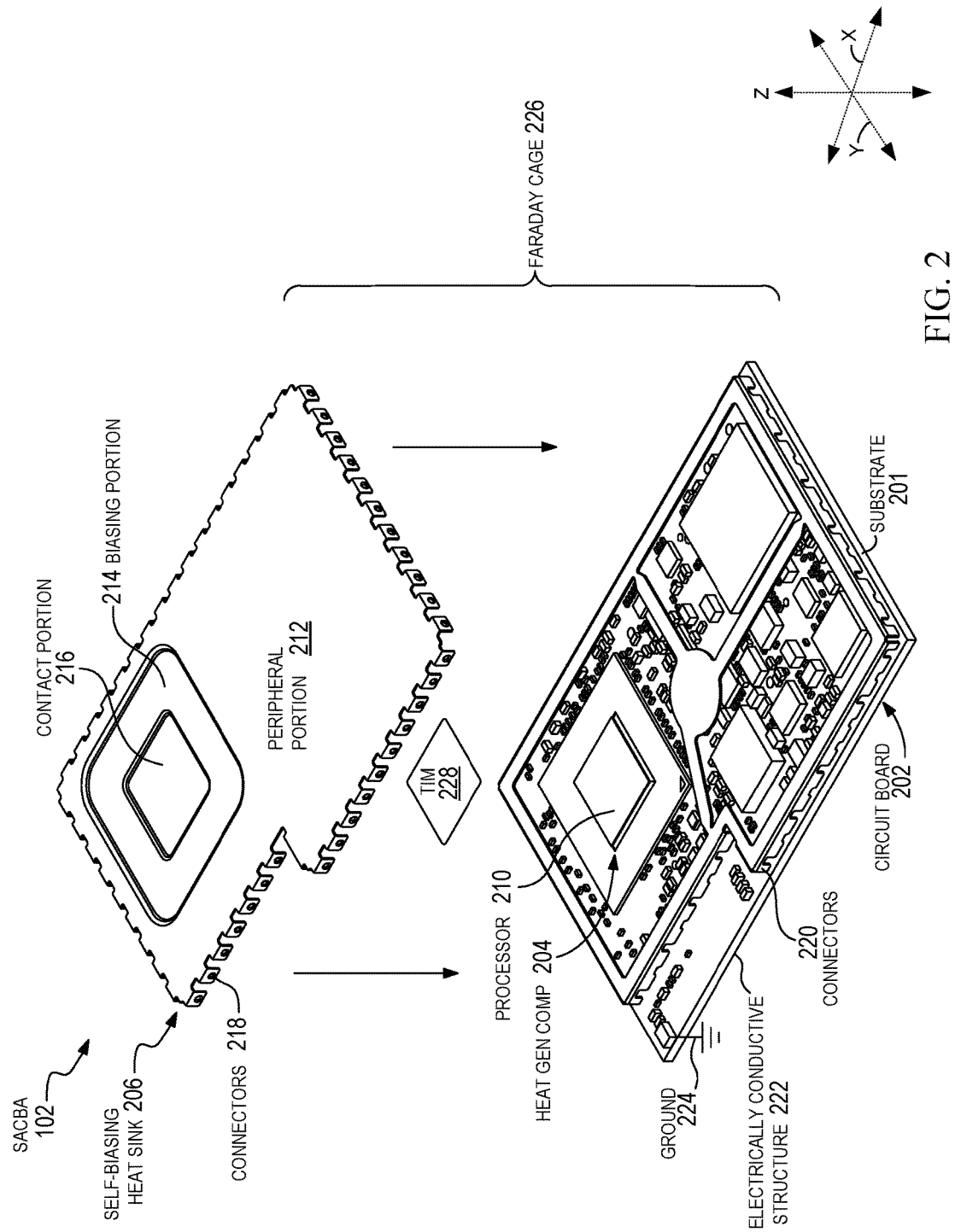
FIG. 2 is an exploded perspective view of an example self-biasing heat sink implementation in accordance with the present concepts.
Figure 3:
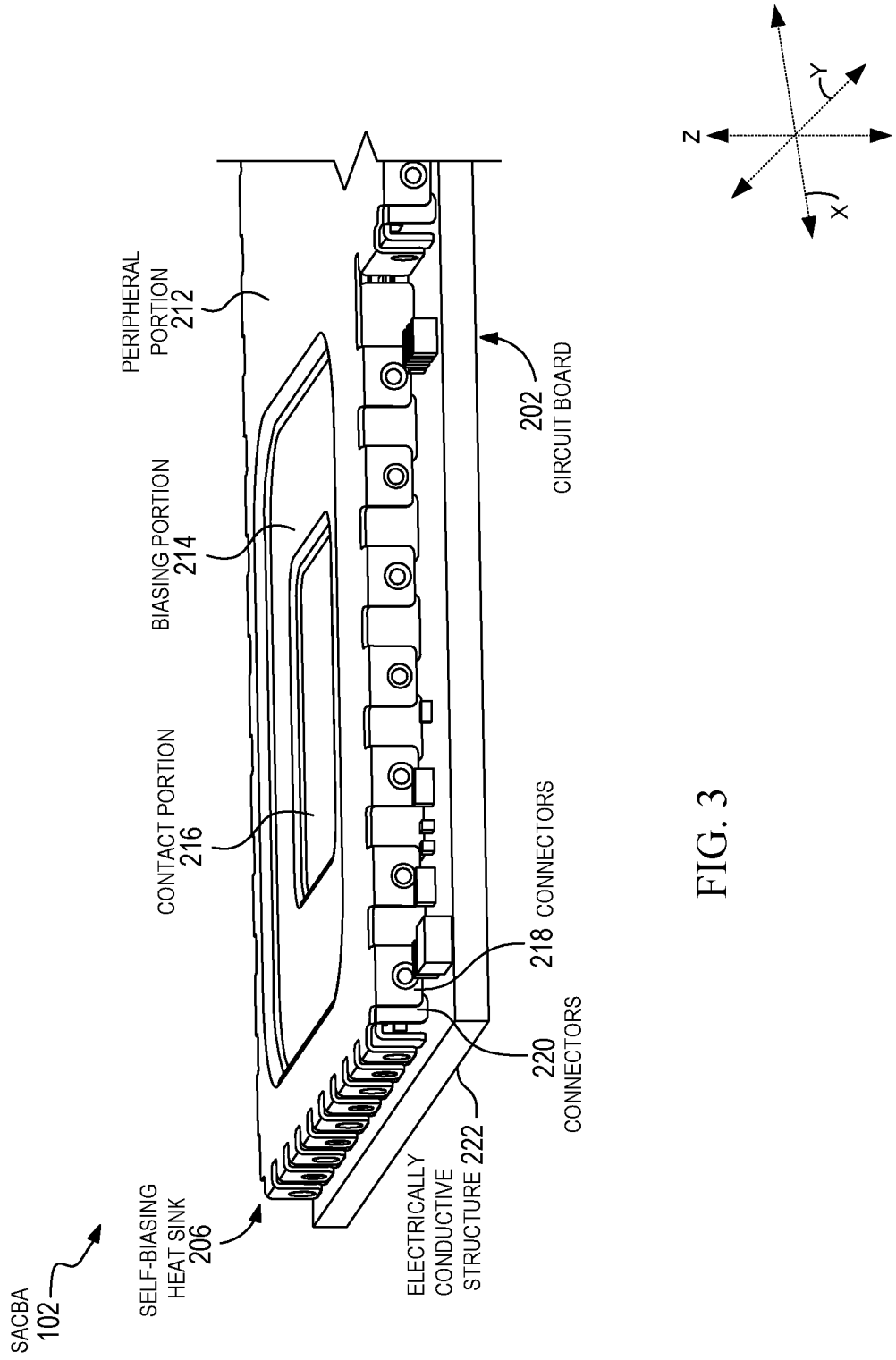
FIG. 3 is a perspective view of the example self-biasing heat sink implementation of FIG. 2.

FIGS. 2-3 collectively show the SACBA 102. FIG. 2 is an exploded view of SACBA 102 and FIG. 3 is an assembled view of the SACBA 102. The SACBA can include a substrate 201. In this case, the substrate is manifest as a circuit board 202, such as a printed circuit board (PCB) or a flexible printed circuit (FPC), a heat generating component 204 secured to the circuit board, and a self-biasing heat sink 206.

In this case, the heat generating component 204 is manifest as a processor 210, such as a central processing unit (CPU) and/or graphics processing unit (GPU). Alternatively or additionally, heat generating components can include various electronic circuitry, memory, storage, and/or batteries, among others.

The self-biasing heat sink 206 can be manifest as a solid material such as metal or a composite, or as a thermal module, such as a vapor chamber, a heat pipe, or a heat spreader, among other configurations. In one example, the metal self-biasing heat sink can be manifest as Copper, or Aluminum, among other materials. In another example, the composite can include graphite, graphene, or a carbon nanostructure, among other materials. In some implementations, material with high thermal conductivities are desirable for heat dissipation via convection from the outer surface and conduction into the substrate.

In this implementation the self-biasing heat sink 206 can include a peripheral portion 212, a biasing portion 214, and/or a contact portion 216. The self-biasing heat sink 206 can also include connectors 218 for securing the self-biasing heat sink to the circuit board 202. In this example, the connectors 218 are formed from the self-biasing heat sink around its periphery. In other implementations the connectors can be separate components that act upon the self-biasing heat sink. In this example, the peripheral portion is generally planar (in the xy-reference plane) and connectors 218 extend orthogonally (in the z-reference direction) from the xy-reference plane. In this case, the self-biasing heat sink's connectors 218 can engage connectors 220 on the circuit board 202 to mechanically connect the self-biasing heat sink and the circuit board. The circuit board can also include an electrically conductive structure or layer 222 that is coupled to system or device ground 224. For instance, the electrically conductive structure can be a layer of metal foil.

When assembled, the self-biasing heat sink 206, connectors 218 and 220, and the electrically conductive structure 222 can collectively complete a Faraday cage 226 around the heat generating component 204. In some implementations, the electrically conductive structure 222 can also be thermally conductive. In some cases the self-biasing heat sink and the thermally and electrically conductive structure contribute to the Faraday Cage around the heat generating component as well as an intimate thermal conduction path from the heat generating component to the substrate via the connectors. Thus, these implementations can provide protection from electrical interference for the heat generating component as well as an enhanced pathway for heat dissipation from the heat generating component.

When assembled, the self-adjusting nature of the SACBA 102 can force the contact portion 216 of the heat sink 206 against the heat generating component 204 to facilitate heat dissipation from the heat generating component to the heat sink. A thermal interface material (TIM) 228 may be positioned between the contact portion and the heat generating component. An amount or thickness of the TIM can be decreased relative to traditional solutions because the reliable force imparted on the contact portion against the heat generating component can facilitate physical contact and therefore heat conduction. Stated another way, forcing the contact portion against the heat generating component in a manner that accommodates tolerances and does not damage the heat generating component can facilitate greater heat removal rates than can be achieved in traditional configurations that rely on a thick layer of thermal interface material because thermal interface materials tend to have lower conduction rates than the heat sink materials.

Figure 4:
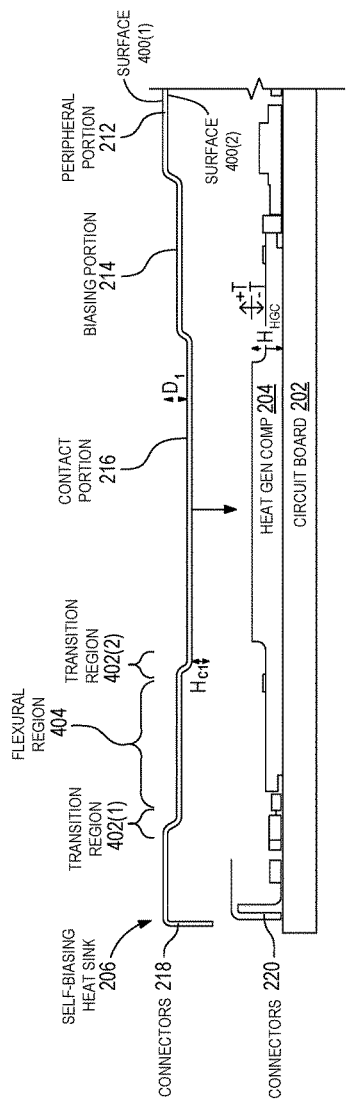
Figure 5:
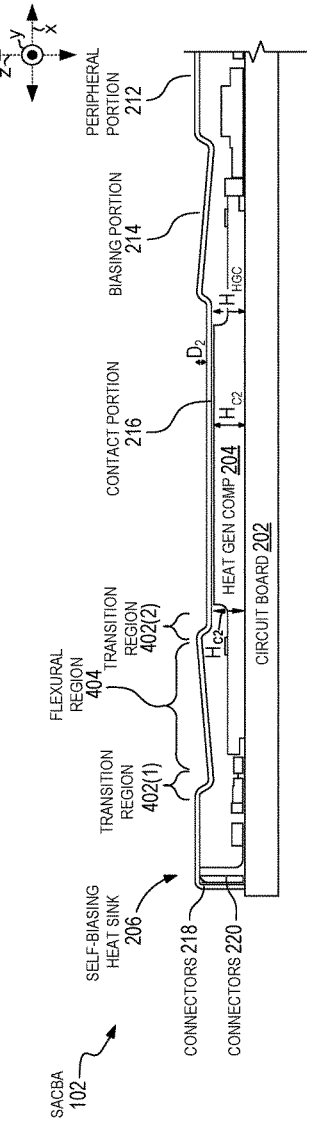

FIGS. 4 and 5 collectively show sectional views of the SACBA 102. FIG. 4 shows the self-biasing heat sink 206 before assembly with the circuit board 202. FIG. 5 shows the SACBA 102 formed from the self-biasing heat sink and the circuit board. As illustrated in FIGS. 4-5, the self-biasing heat sink 206 can include opposing first side or surface 400(1) and second side or surface 400(2).

From a functional standpoint, the self-biasing heat sink 206's biasing portion 214 can serve to bias the contact portion 216 away from the peripheral portion 212. As will be explained relative to FIG. 5, this bias can be partially overcome by engagement (e.g., contact) with the heat generating component 204 at a relatively small force that does not damage the heat generating component (and/or its connections to the circuit board 202). As evidenced in FIG. 4, in this implementation of the self-biasing heat sink 206, the biasing portion 214 is stair-stepped down from the peripheral portion 212, and the contact portion 216 is stair-stepped down from the biasing portion. In this implementation, peripheral portion 212 can be planar in the xy-reference plane. The double stair-stepped configuration can position both the biasing portion 214 and the contact portion 216 on one side of the plane (e.g., in this case on the −z-reference axis side of the plane). In this case, the stair-stepped configuration can extend the contact portion 216 a distance $D_1$ below the peripheral portion 212. This creates a corresponding height to contact $H_{C1}$ (e.g., the distance between the bottom of the contact portion and the bottom of the connector 218).

Characterized another way, a double stair-stepped (e.g., multiple stair-steps) configuration separates the peripheral portion 212 from the biasing portion 214 by a first transition region 402(1) and the biasing portion 214 is separated from the contact portion 216 by a second transition region 402(2). The transition regions 402 can create an interposed flexural region 404. In contrast, a single stair-step does not create a flexural region and in fact has an opposite effect of making the self-biasing heat sink less flexible in the vertical direction (in the z-reference direction). The flexural region 404 may be linear or curvilinear and/or may transition between linear and curvilinear depending on the bias and countervailing forces. Note that while a double stair-step implementation is illustrated, other multi stair-step configurations can employ three or more stair-steps.

Note also that the heat generating component 204 can have a specified height $H_{HGC}$ that can vary by a tolerance (e.g., +/−T). The self-biasing heat sink 206 can accommodate the height variations as will be described below relative to FIG. 5. For instance, contact height $H_{C1}$ can be slightly less than the shortest heat generating component 204 that is still within tolerances (e.g., $H_{C1} < H_{HGC} - T$).

FIG. 5 shows the self-biasing heat sink 206 secured to the circuit board 202 by the interactions of connectors 218 and 220. The connectors can be thought of as locking the self-biasing heat sink 206 and the circuit board 202 into a specific relationship in the x, y, and z reference directions. The heat generating component 204 is creating an upward force on the contact portion 216 that is partially overcoming the downward bias created by the self-biasing heat sink's biasing portion 214. This can be evidenced in that distance $D_2$ is less than $D_1$ of FIG. 4 and contact height $H_{C2}$ is greater than $H_{C1}$. Thus, the underside of the contact portion 216 is now in contact with the top of the heat generating component 204 (or separated slightly by a thin layer of TIM 228) so that the height $H_{C2}$ is generally equivalent to the height of the heat generating component $H_{HGC}$.

The biasing portion 214 can ensure contact with the heat generating component 204 and can flex at a force value that does not damage the functioning of the heat generating component 204 and/or other aspects of the SACBA 102. As mentioned, this cannot be accomplished with a single stair-step configuration because a single stair-step makes the self-biasing heat sink 206 more rigid (e.g., less flexible) in the z-reference direction and more likely to damage the heat generating component.

As mentioned above, the biasing portion 214 can ensure contact with the heat generating component 204 and can flex at a force value that does not damage the functioning of the heat generating component 204 and/or other aspects of the SACBA 102. One implementation example of the self-biasing heat sink 206 can be manifest as a copper foil having a thickness of 0.150 millimeters. The contact portion can be 10×10 millimeters, and the biasing portion can be 18×18 millimeters. This implementation can be used with a heat generating component manifest as a CPU. The forces and system constraints can include a deflection range with system tolerance (T): 20+/−10 Newtons (N). The CPU can withstand 40N. Thus, the biasing portion 214 can be flexed when the contact portion 216 contacts the CPU without damaging the functionality of the CPU and/or the circuit board assembly (e.g., self-adjusting circuit board assembly 102). For example, the self-biasing heat sink 206 can be secured to the circuit board 202 so that the downward force of the contact portion 216 is about 20 N or less against the heat generating component 204. The heat generating component 204 can impart an opposing, slightly higher force (e.g., less than 30 N) on the contact portion that partially overcomes the bias of the biasing portion 214 and forces the contact portion 216 slightly upwards. This second force can be safely less than a third force at which damage occurs to the heat generating component (and/or to its connections to the circuit board), such as 40 N. Of course, this example is provided for purposes of explanation and other examples can be configured to be resiliently biased against more or less robust (e.g., delicate) heat generating components.

In this implementation, the biasing and flex of the biasing portion 214 is facilitated by the flexural region 404 bounded by the transition regions 402. The transition regions 402(1) and 402(2) serve to lower the contact portion 216 below the peripheral portion 212. Transition regions 402(1) and 402(2) at the end of the flexural region 404 allow the flexural region to readily transition from a first condition to a second condition when exposed to the upward force imparted by contact with the heat generating component 204. In this example, FIG. 4 shows the first condition where the flexural region 404 is generally parallel to the xy-reference plane. FIG. 5 shows the second condition where the flexural region 404 is inclined from transition region 402(1) toward transition region 402(2). The flexural region may have a generally planar configuration in the second condition or may be curved between the transition regions.

Further still, in the illustrated configuration the peripheral portion 212 is generally planar and the biasing portion 214 and the contact portion 216 lie on the same side of the plane (e.g., in the −z-reference direction in FIG. 4). Contact with the heat generating component 204 can force the contact portion 216 and the biasing portion 214 back toward (e.g., closer to) the peripheral portion 212, but the contact portion and the biasing portion remain on the same side (e.g., on the −z-reference side) and the peripheral portion 212 remains generally planar (see FIG. 5). This cannot be accomplished with a single stair-step configuration, which would damage the heat generating component and/or deflect the peripheral portion out of the generally planar configuration when exposed to an upward force from the heat generating component 204.

Figure 6:
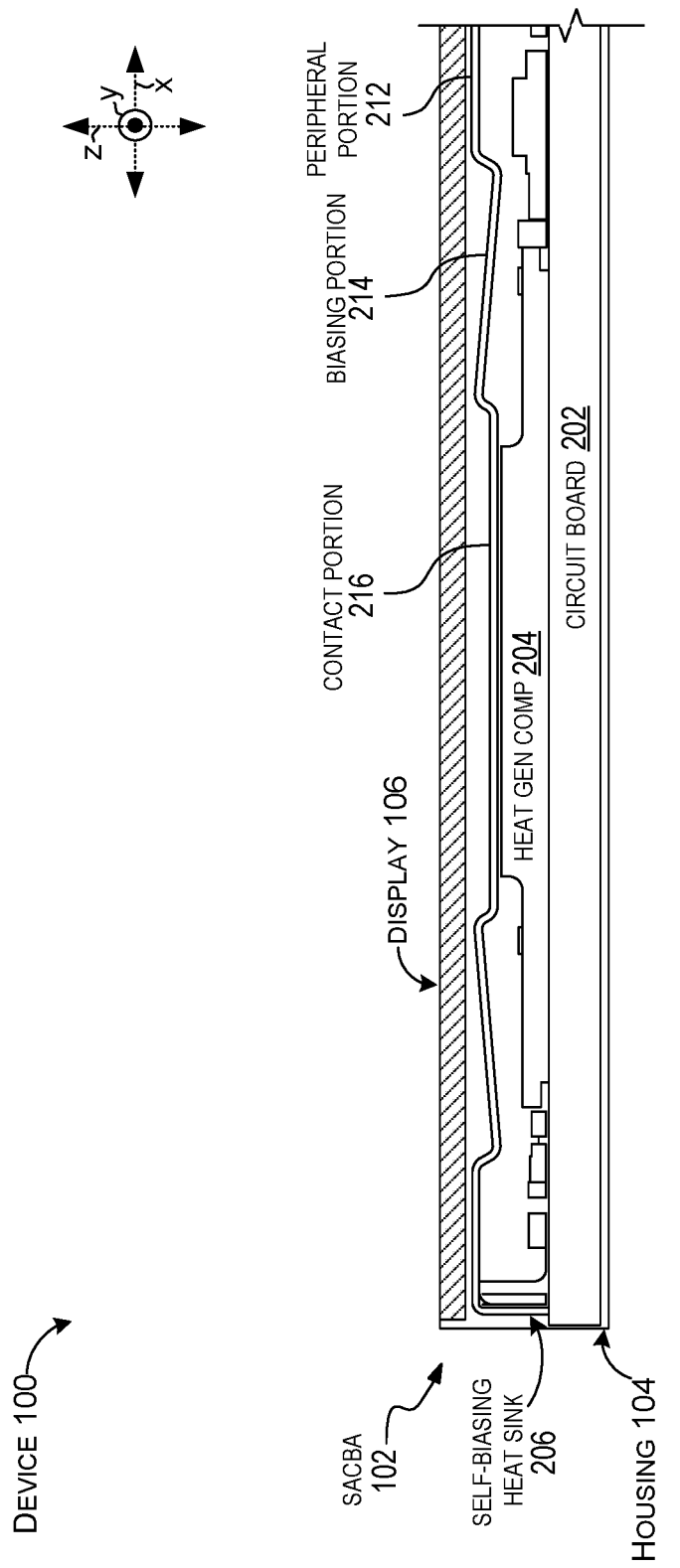

FIG. 6 shows a sectional view of device 100. In this implementation, an area above the self-biasing heat sink 206 is occupied by the display 106. Thus, as can be seen from FIGS. 4-6, in this implementation, the ability of the self-biasing heat sink 206 to maintain the contact portion 216 and the biasing portion 214 below the peripheral portion 212 when exposed to the upward force imparted by the heat generating component 204 and the ability of the peripheral portion 212 to maintain a planar configuration can allow the self-biasing heat sink to operate in this space constrained environment. This configuration can allow device 100 to be thinner and/or reduce damage caused by contact between the display and the self-biasing heat sink.

FIGS. 7-8 show an implementation where the self-biasing heat sink 206A is manifest as a heat pipe 702 in a self-adjusting circuit board assembly 102A. The heat pipe includes a lower layer 704 and an upper layer 706 separated by a heat conducting fluid 708. In this implementation, the upper layer 706 is generally planar. The lower layer 704 includes contact portion 216 that is biased away from the upper layer with a force that can be partially overcome by contact with heat generating component 204 without damaging the heat generating component and/or distending the upper layer.

Figure 9:
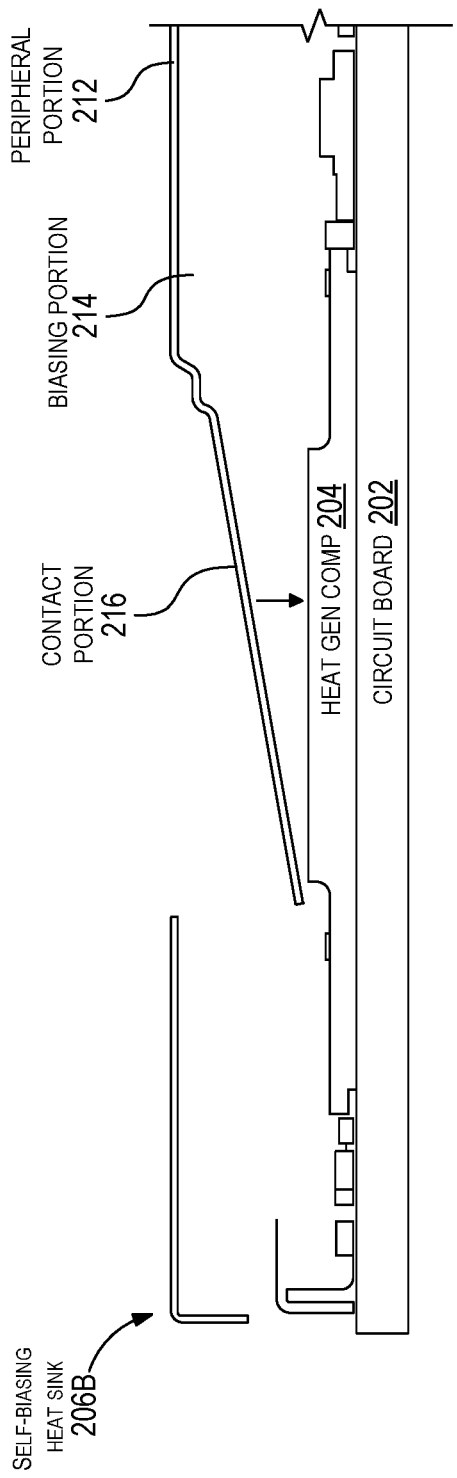
Figure 10:
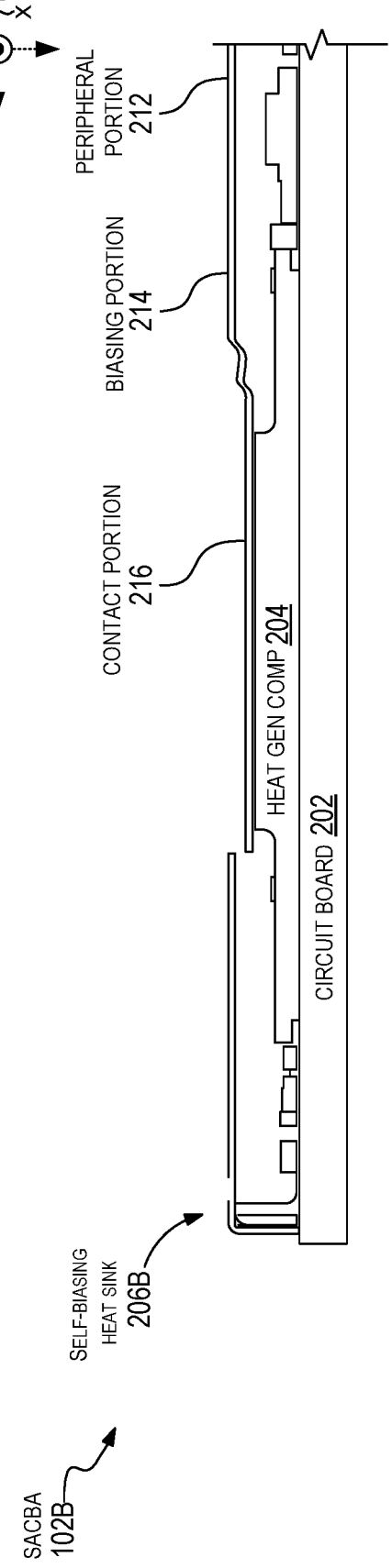

FIGS. 9-10 show another self-biasing heat sink 206B. In this case, the contact portion 216 is cantilevered from the biasing portion 214. Contact with the heat generating component 204 in the assembled self-adjusting circuit board assembly 102B can flex the biasing portion so that the contact portion 216 is parallel to the peripheral portion 212.

Figure 11:
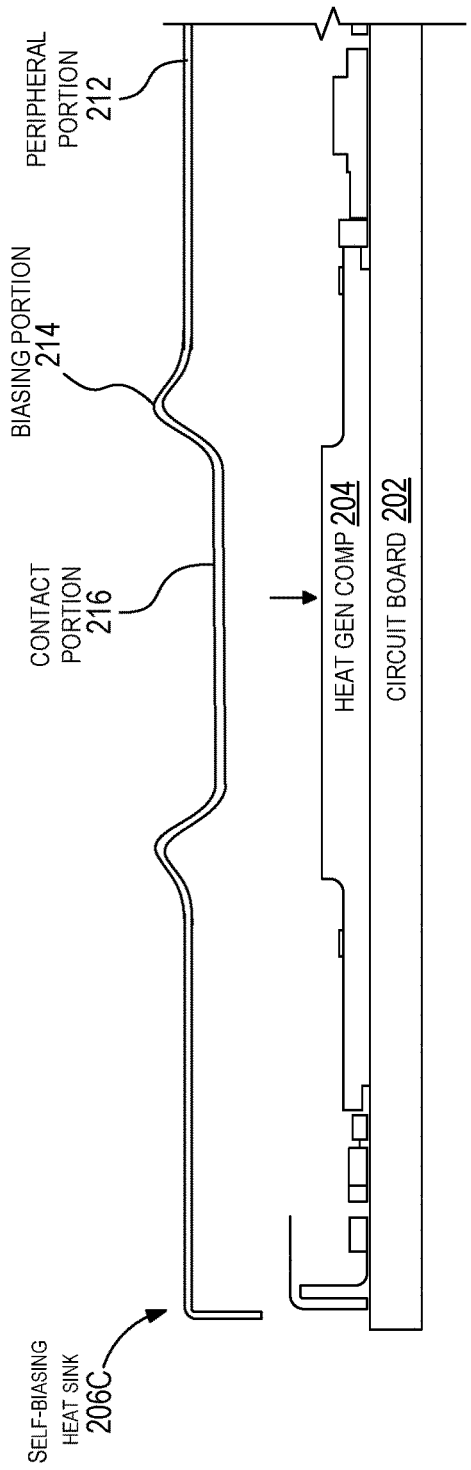
Figure 12:
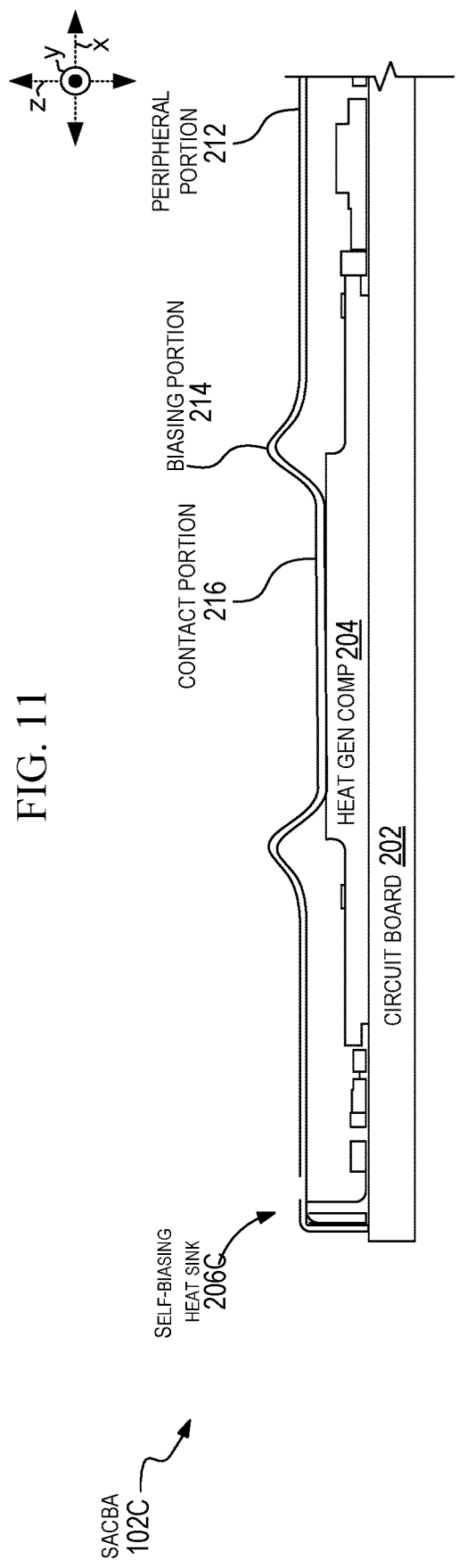

FIGS. 11-12 show another self-biasing heat sink 206C. In this example, the biasing portion 214 has a wave shape that biases the contact portion 216 away from the peripheral portion 212. Contact with the heat generating component 204 in the assembled self-adjusting circuit board assembly 102C can force the contact portion 216 upward toward the peripheral portion 212 by flexing the biasing portion 214.

Various self-biasing heat sink architectures are described above. The present concepts can be implemented in other architectures that are consistent with the described functionality.

The present device cooling concepts can be utilized with various types of devices, such as computing devices that can include but are not limited to notebook computers, tablet computers, smart phones, wearable smart devices, gaming devices, entertainment consoles, rigid devices, flexible devices, home and enterprise appliances, automobiles, machinery, and/or other developing or yet to be developed types of devices. As used herein, a computing device can be any type of device that has some amount of processing and/or storage capacity. A mobile computing device can be any computing device that is intended to be readily transported by a user.

ADDITIONAL EXAMPLES

Various examples are described above. Additional examples are described below. One example can be manifest as a device that includes a heat generating component positioned on a substrate and a self-biasing heat sink. The self-biasing heat sink can be positioned over the heat generating component and secured to the substrate. The self-biasing heat sink can comprise a biasing portion interposed between a contact portion and a peripheral portion. The biasing portion can be configured to resiliently bias the contact portion away from the peripheral portion and toward the heat generating component. Engagement with the heat generating component can partially overcome the bias of the biasing portion and is configured to force the contact portion back toward the peripheral portion.

A further example can include any combination of the above and/or below examples where the engagement of the contact portion comprises direct contact with the heat generating component or wherein the engagement of the contact portion comprises contact with a material interposed between the contact portion and the heat generating component.

A further example can include any combination of the above and/or below examples where the material comprises a thermal interface material.

A further example can include any combination of the above and/or below examples where the self-biasing heat sink comprises a solid material or wherein the self-biasing heat sink comprises a thermal module.

A further example can include any combination of the above and/or below examples where the self-biasing heat sink comprises a vapor chamber, a heat pipe, or a heat spreader.

A further example can include any combination of the above and/or below examples where the substrate includes an electrically conductive structure and wherein the self-biasing heat sink and the electrically conductive structure contribute to a Faraday Cage around the heat generating component.

A further example can include any combination of the above and/or below examples where the substrate includes a thermally and electrically conductive structure and wherein the self-biasing heat sink and the thermally and electrically conductive structure contribute to a Faraday Cage around the heat generating component as well as a thermal conduction path from the heat generating component to the substrate via connectors that secure the self-biasing heat sink to the substrate.

A further example can include any combination of the above and/or below examples where the self-biasing heat sink includes connectors that secure the self-biasing heat sink to the substrate and complete the Faraday cage around the heat generating component.

A further example can include any combination of the above and/or below examples where the peripheral portion is generally planar and wherein the connectors are formed around a periphery of the peripheral portion.

A further example can include any combination of the above and/or below examples where the connectors extend generally orthogonal to the generally planar peripheral portion.

A further example can include any combination of the above and/or below examples where the biasing portion comprises a double stair-step between the peripheral portion and the contact portion.

A further example can include any combination of the above and/or below examples where the biasing portion comprises multiple stair-steps between the peripheral portion and the contact portion.

A further example can include any combination of the above and/or below examples where the multiple stair-steps is comprised of at least three stair-steps.

A further example can include any combination of the above and/or below examples where the self-biasing heat sink comprises a metal or a composite.

A further example can include any combination of the above and/or below examples where the composite comprises graphite, graphene, or a carbon nanostructure.

Another example can be manifest as a self-biasing heat sink that includes a peripheral portion having first and second sides and a biasing portion that couples the peripheral portion to a contact portion. The biasing portion and the contact portion are positioned on the first side of the peripheral portion and the biasing portion creates a bias in a direction from the contact portion away from the peripheral portion. The bias can be partially overcome by applying a force to the contact portion towards the first side of the peripheral portion.

A further example can include any combination of the above and/or below examples where the biasing portion includes a planar region and wherein the peripheral portion is planar and the contact portion is planar.

A further example can include any combination of the above and/or below examples where the first and second sides, the peripheral portion, and the contact portion are parallel until the bias is partially overcome and the first side is angled relative to the peripheral portion and the contact portion.

A further example can include any combination of the above and/or below examples where the biasing portion includes a flexural region positioned between a first transition region with the peripheral portion and a second transition region with the contact portion and where the flexural region is planar when the biasing portion is fully extended away from the peripheral portion and curved when the force is applied and the biasing portion is pushed toward the peripheral portion.

A further example can include any combination of the above and/or below examples where the force is less than 40 Newtons.

A further example can include any combination of the above and/or below examples where the force does not change a shape of the peripheral portion.

Another example can be manifest as a device that includes a processor secured to a circuit board and a self-biasing heat sink positioned over the processor and secured to the circuit board to complete a Faraday Cage around the processor. The self-biasing heat sink comprises a peripheral portion positioned in a first plane and a contact portion positioned in a second different plane and biased against the processor by an interposed biasing portion that is flexed to force the contact portion against the processor.

A further example can include any combination of the above and/or below examples where the biasing portion resides between the first plane and the second different plane.

A further example can include any combination of the above and/or below examples where the force does not cause any portion of the self-biasing heat sink across the first plane in a direction opposite from the second different plane.

A further example can include any combination of the above and/or below examples where the biasing portion includes a flexural region positioned between a first transition region with the peripheral portion and a second transition region with the contact portion.

A further example can include any combination of the above and/or below examples where the biasing portion flexes at a lower value than the peripheral portion and the contact portion such that another force applied by the processor to the contact portion toward the first plane causes flexing of the biasing portion while the peripheral portion remains unflexed and in the first plane.

A further example can include any combination of the above and/or below examples where the another force is below a third force at which damage occurs to the processor.

A further example can include any combination of the above and/or below examples where the force is less than 20 Newtons, the another force is less than 30 Newtons, and the third force is at least 40 Newtons.

CONCLUSION

Although techniques, methods, devices, systems, etc., pertaining to device cooling are described in language specific to structural features and/or methodological acts, it is to be understood that the subject matter defined in the appended claims is not limited to the specific features or acts described. Rather, the specific features and acts are disclosed as example forms of implementing the claimed methods, devices, systems, etc.

The invention claimed is:

1. A device, comprising:
   a heat generating component positioned on a substrate; and,
   a self-biasing heat sink positioned over the heat generating component and secured to the substrate, the self-biasing heat sink comprising a biasing portion interposed between a contact portion and a peripheral portion, the biasing portion configured to resiliently bias the contact portion away from the peripheral portion and toward the heat generating component,
   wherein engagement with the heat generating component partially overcomes the bias of the biasing portion and is configured to force the contact portion back toward the peripheral portion.

2. The device of claim 1, wherein the engagement of the contact portion comprises direct contact with the heat generating component or wherein the engagement of the contact portion comprises contact with a material interposed between the contact portion and the heat generating component.

3. The device of claim 2, wherein the material comprises a thermal interface material.

4. The device of claim 1, wherein the self-biasing heat sink comprises a solid material or wherein the self-biasing heat sink comprises a thermal module.

5. The device of claim 4, wherein the self-biasing heat sink comprises a vapor chamber, a heat pipe, or a heat spreader.

6. The device of claim 1, wherein the substrate includes an electrically conductive structure and wherein the self-biasing heat sink and the electrically conductive structure contribute to a Faraday Cage around the heat generating component.

7. The device of claim 6, wherein the self-biasing heat sink includes connectors that secure the self-biasing heat sink to the substrate and complete the Faraday cage around the heat generating component.

8. The device of claim 7, wherein the peripheral portion is generally planar and wherein the connectors are formed around a periphery of the peripheral portion.

9. The device of claim 1, wherein the substrate includes a thermally and electrically conductive structure and wherein the self-biasing heat sink and the thermally and electrically conductive structure contribute to a Faraday Cage around the heat generating component as well as a thermal conduction path from the heat generating component to the substrate via connectors that secure the self-biasing heat sink to the substrate.

10. The device of claim 1, wherein the biasing portion comprises a double stair-step between the peripheral portion and the contact portion.

11. The device of claim 1, wherein the biasing portion comprises multiple stair-steps between the peripheral portion and the contact portion.

12. The device of claim 11, wherein the multiple stair-steps comprises at least three stair-steps.

13. The device of claim 1, wherein the self-biasing heat sink comprises a metal or a composite.

14. The device of claim 13, wherein the composite comprises graphite, graphene, or a carbon nanostructure.

15. A self-biasing heat sink, comprising:
a peripheral portion having first and second sides; and,
a biasing portion that couples the peripheral portion to a contact portion,
wherein the biasing portion and the contact portion are positioned on the first side of the peripheral portion and the biasing portion creates a bias in a direction from the contact portion away from the peripheral portion, and
wherein the bias can be partially overcome by applying a force to the contact portion towards the first side of the peripheral portion.

16. The self-biasing heat sink of claim 15, wherein the biasing portion includes a planar region and wherein the peripheral portion is planar and the contact portion is planar.

17. The self-biasing heat sink of claim 15, wherein the biasing portion, the peripheral portion and the contact portion are parallel until the bias is partially overcome and then the biasing portion is angled relative to the peripheral portion and the contact portion.

18. The self-biasing heat sink of claim 15, wherein the biasing portion includes a flexural region positioned between a first transition region with the peripheral portion and a second transition region with the contact portion and where the flexural region is planar when the biasing portion is fully extended away from the peripheral portion and curved when the force is applied and the biasing portion is pushed toward the peripheral portion.

19. The self-biasing heat sink of claim 15, wherein the force is less than 40 Newtons.

20. The self-biasing heat sink of claim 15, wherein the force does not change a shape of the peripheral portion.

21. A device, comprising:
a processor secured to a circuit board; and,
a self-biasing heat sink positioned over the processor and secured to the circuit board to complete a Faraday Cage around the processor, the self-biasing heat sink comprising a peripheral portion positioned in a first plane and a contact portion positioned in a second different plane and biased against the processor by an interposed biasing portion that is flexed with a force to bias the contact portion toward the processor, wherein contact of the biasing portion against the processor causes an inner region of the biasing portion proximate to the contact portion to be closer to the first plane than an outer region proximate to the peripheral portion.

22. The device of claim 21, wherein the biasing portion resides between the first plane and the second different plane.

23. The device of claim 21, wherein contact with the processor does not cause any portion of the self-biasing heat sink to cross the first plane.

24. The device of claim 21, wherein the biasing portion includes a flexural region positioned between a first transition region with the peripheral portion and a second transition region with the contact portion, wherein the flexural region extends between the inner region and the outer region.

25. The device of claim 21, wherein the biasing portion flexes at a lower value than the peripheral portion and the contact portion such that another force applied by the processor to the contact portion toward the first plane causes flexing of the biasing portion while the peripheral portion remains unflexed and in the first plane.

26. The device of claim 25, wherein the another force is below a third force at which damage occurs to the processor.

27. The device of claim 26, wherein the force is less than 20 Newtons, the another force is less than 30 Newtons, and the third force is at least 40 Newtons.

* * * * *